United States Patent

Chakravarti et al.

Patent Number: 6,159,870
Date of Patent: Dec. 12, 2000

[54] BOROPHOSPHOSILICATE GLASS INCORPORATED WITH FLUORINE FOR LOW THERMAL BUDGET GAP FILL

[75] Inventors: Ashima B. Chakravarti, Hopewell Junction; Richard A. Conti, Mount Kisco; Frank V. Liucci, Wappingers Falls; Darryl D. Restaino, Modena, all of N.Y.

[73] Assignee: International Business Machines Corporation, Armonk, N.Y.

[21] Appl. No.: 09/210,411

[22] Filed: Dec. 11, 1998

[51] Int. Cl.$^7$ .......................... H01L 21/31; H01L 21/469
[52] U.S. Cl. .......................... 438/784; 438/763; 438/783
[58] Field of Search .................................. 438/783, 784, 438/763, 766, 770

[56] References Cited

U.S. PATENT DOCUMENTS

| | | |
|---|---|---|
| 5,166,101 | 11/1992 | Lee et al. . |
| 5,180,692 | 1/1993 | Ibuka et al. . |
| 5,231,058 | 7/1993 | Maeda et al. . |
| 5,286,681 | 2/1994 | Maeda et al. . |
| 5,314,845 | 5/1994 | Lee et al. . |
| 5,354,387 | 10/1994 | Lee et al. . |
| 5,462,899 | 10/1995 | Ikeda . |
| 5,605,867 | 2/1997 | Sato et al. . |
| 5,629,246 | 5/1997 | Iyer ......................................... 437/238 |
| 5,633,211 | 5/1997 | Imai et al. ............................... 438/760 |
| 5,646,075 | 7/1997 | Thakur et al. . |
| 5,726,090 | 3/1998 | Jang et al. . |
| 5,827,778 | 11/1998 | Yamada ................................... 438/637 |
| 5,827,785 | 11/1998 | Bhan et al. .............................. 438/784 |
| 6,057,250 | 5/2000 | Kirchhoff et al. ....................... 438/784 |

FOREIGN PATENT DOCUMENTS 0 562 625 A2  9/1993  European Pat. Off. .

OTHER PUBLICATIONS

J. Sato et al. "Very Low Temperature CVD Of SIO$_2$ Films Using Ozone And Organosilane "I.c.s Spring Meeting, May 1971, abstract No. 9, page 9, page 31., IC Engineering Department, Fujitsu Ltd., Jaapan Primary Examiner—Richard Booth
Assistant Examiner—Walter L. Lindsay, Jr.
Attorney, Agent, or Firm—DeLio & Peterson, LLC; Peter W. Peterson; Steven Capella

[57] ABSTRACT

A method of depositing a fluorinated borophosphosilicate glass (FBPSG) on a semiconductor device as either a final or interlayer dielectric film. Gaps having aspect ratios greater than 6:1 are filled with a substantially void-free FBPSG film at a temperature of about 480° C. at sub-atmospheric pressures of about 200 Torr. Preferably, gaseous reactants used in the method comprise TEOS, FTES, TEPO and TEB with an ozone/oxygen mixture. Dopant concentrations of boron and phosphorus are sufficiently low such that surface crystallite defects and hygroscopicity are avoided. The as-deposited films at lower aspect ratio gaps are substantially void-free such that subsequent anneal of the film is not required. Films deposited into higher aspect ratio gaps are annealed at or below about 750° C., well within the thermal budget for most DRAM, logic and merged logic-DRAM chips. The resultant FBPSG layer contains less than or equal to about 5.0 wt % boron, less than about 4.0 wt % phosphorus, and about 0.1 to 2.0 wt % fluorine.

39 Claims, 2 Drawing Sheets

BOROPHOSPHOSILICATE GLASS INCORPORATED WITH FLUORINE FOR LOW THERMAL BUDGET GAP FILL

BACKGROUND OF THE INVENTION

1. Field of the Invention

This invention relates to a method of manufacturing a semiconductor device and, in particular, to a method of forming a low temperature, low viscosity, fluorinated borophosphosilicate glass (FBPSG) layer on the device.

2. Description of Related Art

In the manufacture of semiconductor electronic components, it is necessary to encapsulate the component in a glass or to use glass as an interlayer dielectric film. Typically, the glass layer is a $SiO_2$ layer which is formed on the surface of the component using chemical vapor deposition (CVD). As a result of increasing demands in industry, the need for finer circuitry patterns and increased circuit density have made it necessary to develop improved glass layers for layering the semiconductor surfaces during the fabrication process. Advanced semiconductor devices, such as highly dense dynamic random access memories (DRAMs) or logic chips, impose severe restrictions on the times, temperatures, and atmospheres of all thermal process steps.

Glass films such as borophosphosilicate glass (BPSG) films or layers, are important in planarizing advanced DRAM devices having increased gate stack heights and integrated circuit densities. Such doped oxide glass layers lower the melting temperature of the glass layer and permit the layers to soften and reflow thereby creating a planar surface on the semiconductor device. The BPSG layers are typically reflowed after deposition in the range of its glass transition temperature which is about 800–850° C. The glass transition temperature is the temperature at which the deposited glass starts to flow. The glass transition temperature is primarily a function of the boron and phosphorous concentrations of the BPSG and depend on the deposition process as well.

It is highly desirable that the reflow temperature be as low as possible for process effectiveness and to avoid temperature damaging effects to the semiconductor device during the fabrication process. As the circuit density and the need for finer circuit patterns have increased, there is a recognized need to formulate and process oxide glass films to fill even smaller gaps on the surface of the semiconductor device without voids or bubbles within the oxide glass layer or surface defects. Up until now, a BPSG layer used as an inter-level dielectric layer can provide void-free fill of structures only as narrow as 0.10 $\mu$m with aspect ratios up to 6:1.

However, in DRAM and logic chips having increased gate stack heights and integrated circuit densities, there is a greater need to provide void-free fill of gaps with aspect ratios of greater than 6:1 and at temperatures lower than 750° C. to avoid destroying the chip. Thus, in lowering the thermal budget for DRAM and logic chips, it is highly desirable that the viscosity of the BPSG film be even lower during the fabrication process to provide a void-free fill of structures having aspect ratios greater than 6:1. The viscosity of the BPSG can be decreased by increasing the reflow temperature, which is undesirable, or by increasing the dopant concentrations of boron and phosphorus in the BPSG. In addition, the size of the as-deposited void (i.e., before annealing to reflow the film and reduce or eliminate the void) should be as small as possible. As the aspect ratio of narrow features increase and allowable thermal budgets decrease, minimizing the size of the as-deposited void takes on greater importance.

It is known in the art that fluorine doping of the BPSG increases the surface tension and decreases the viscosity to enhance fill characteristics at lower temperatures but only in high aspect ratio gaps of up to 6:1. However, the dopant concentrations for boron and phosphorus are limited to about 5 weight percent each since exceeding this concentration results in surface crystal growth of boric acid or boric phosphate after deposition. Surface crystals are not desirable due to fabrication integration problems with subsequent lithography, reactive ion etching and chemical mechanical polishing processes. Furthermore, increasing dopant concentrations lead to hygroscopic films.

Bearing in mind the problems and deficiencies of the prior art, it is therefore an object of the present invention to provide a method for forming a fluorinated borophosphosilicate glass on a substrate such as a semiconductor wafer having improved as-deposited gap fill properties and a lower reflow temperature without formation of crystallite defects.

It is another object of the present invention to provide a method of manufacturing a semiconductor wafer having a layer of fluorinated borophosphosilicate glass thereon which glass has improved gap fill properties and a lower reflow temperature.

A further object of the invention is to provide a method of forming a borophosphosilicate glass with enhanced gap fill capability to provide a void free fill of structures with aspect ratios greater than 6:1.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of forming a fluorine doped oxide glass film on a semiconductor device in a chemical vapor deposition chamber comprising the steps of:

(a) providing a semiconductor device in the chamber;

(b) providing a gaseous silicon source;

(c) providing a gaseous oxygen source;

(d) providing a gaseous fluorine source;

(e) providing a gaseous boron source;

(f) providing a gaseous phosphorus source;

(g) injecting the gaseous sources into a chemical vapor deposition chamber; and (h) depositing a layer of fluorine doped oxide glass on the semiconductor device at a temperature of about 480° C. to 650° C. and a sub-atmospheric pressure of about 200 to 750 Torr.

Preferably, the method further includes the step of reacting the gaseous sources to deposit the layer of fourine doped oxide glass on the semiconductor substrate.

The method may further include the step of reflowing the layer of doped oxide glass on the semiconductor substrate at a temperature of about 480° C. to 725° C. The step of reflowing may comprise steam annealing. Preferably, the step of reflowing and step (h) occur simultaneously.

In step (a), the semiconductor device may comprise a logic chip, a dynamic random access memory chip or a merged logic and dynamic random access memory chip.

Preferably, in step (b) the gaseous silicon source comprises tetraethylorthosilicate. Preferably, in step (d) the gaseous fluorine source is selected from the group consisting of fluorotriethoxysilane, difluorosilane, trifluorosilane, and tetrafluorosilane. In step (d), where the gaseous fluorine source comprises trifluorosilane or tetrafluorosilane, a plasma is generated prior to depositing a layer of fluorine doped oxide glass on the semiconductor device. Most preferably, in step (d) the gaseous fluorine source comprises fluorotriethoxysilane. Preferably, in step (e) the gaseous boron source is selected from the group consisting of triethylborate, trimethylborate, and mixtures thereof. Preferably, in step (f) the gaseous phosphorus source is selected from the group consisting of tetraethylphosphate, phosphine, triethylphosphate, and mixtures thereof.

Preferably, the layer of fluorine doped oxide glass fills high aspect ratio gaps on the semiconductor device having an aspect ratio greater than 7:1.

Preferably, step (g) comprises injecting the gaseous sources separately into the chamber. Most preferably, step (g) comprises premixing the silicon and fluorine sources as a first injection stream, premixing the boron and phosphorus sources as a second injection stream prior to injecting the gaseous sources into a chemical vapor deposition chamber.

Preferably, step (h) occurs at a temperature of about 550° C. to 650° C.

Preferably, in step (c) the gaseous oxygen source is selected from the group consisting of ozone, oxygen/ozone mixture, and hydrogen peroxide.

The resulting layer of fluorine doped oxide glass, preferably, contains less than or equal to about 5.0 wt % of boron, less than about 4.0 wt % of phosphorus, and about 0.1 to 2.0 wt % fluorine.

Step (h) may form a final deposition layer on the semiconductor device, or a planarized intermediate layer on the semiconductor device which then further includes the step of continuing processing the semiconductor device.

In yet another aspect, the present invention is directed to a method of filling high aspect ratio gaps on a semiconductor wafer comprising the steps of:

(a) providing a semiconductor wafer having high aspect ratios gaps of greater than 7:1; and (b) filling the gaps with fluoroborophosphosilicate glass.

Step (b) may further comprise the steps of:

(a) providing a gaseous tetraethylorthosilicate source;

(b) providing a gaseous oxygen source;

(c) providing a gaseous fluorine source selected from the group consisting of fluorotriethoxysilane, difluorosilane, trifluorosilane, and tetrafluorosilane;

(d) providing a gaseous boron source selected from the group consisting of triethylborate, trimethylborate, and a mixture thereof;

(e) providing gaseous phosphorus source selected from the group consisting of tetraethylphosphate, phosphine, triethylphosphate, and a mixture thereof; and (f) chemically vapor depositing the insulating glass film at a temperature of about 480° to 650° C. and a pressure of about 200 to 760 Torr, wherein the insulating glass film contains less than or equal to about 5.0 wt % boron, less than about 4.0 wt % phosphorus, and about 0.1 to 2.0 wt % fluorine and is substantially void-free.

The method may further include the step of annealing the insulating glass film at a temperature of about 700° to 725° C.

In yet another aspect, the present invention is directed to a method of forming an insulating film on a semiconductor wafer comprising the steps of:

(a) providing a semiconductor wafer having a plurality of high aspect ratio gaps thereon;

(b) providing a gaseous source of silicon, fluorine, boron, phosphorus and oxygen for chemical vapor depositing a first insulating glass film over the wafer at a temperature of about 480° to 650° C. and a pressure of about 200 to 760 Torr at a rate of about 400 to 1000 Å/minute;

(c) substantially filling the gaps with the first insulating glass film containing less than or equal to about 5.0 wt % boron, less than about 4.0 wt % phosphorus, and about 0.1 to 2.0 wt % fluorine; and (d) coating the surface of the wafer by chemically vapor depositing a second insulating glass film containing a lower boron, fluorine, and phosphorous concentration than the first insulating glass film.

Preferably, the silicon source flows into the chamber at a rate of about 10.8 to 32.25 sccm, most preferably comprising tetraethylorthosilicate flowing into the chamber at a rate of about 18.8 sccm. Preferably, the fluorine source flows into the chamber at a rate of about 2.50 to 9.85 sccm, most preferably comprising fluorotriethoxysilane flowing into the chamber at a rate of about 6.2 sccm. Preferably, the boron source flows into the chamber at a rate of about 3.07 to 12.27 sccm, most preferably comprising triethylborate flowing into the chamber at a rate of about 7.7 sccm. Preferably, the phosphorus source flows into the chamber at a rate of about 2.50 to 9.85 sccm, most preferably, comprising triethylphosphate flowing into the chamber at a rate of about 4.9 sccm.

Preferably, step (d) comprises coating the surface of the wafer by chemically vapor depositing an undoped glass film.

The method may further include the step of annealing the first and second insulating glass films at or below 700° C.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
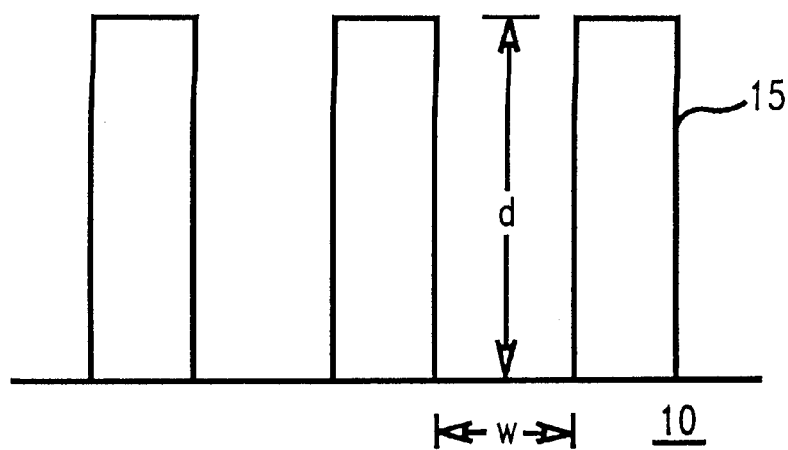
FIG. 1 is an elevated partial cross-section of a typical semiconductor device prior to deposition of an insulating glass film.

In describing the preferred embodiment of the present invention, reference will be made herein to FIGS. 1–4 of the drawings in which like numerals refer to like features of the invention. Features of the invention are not necessarily shown to scale in the drawings.

The FBPSG made in accordance with the present invention is intended as a final or interlayer dielectric insulating film for a semiconductor device such as a complementary metal oxide semiconductor (CMOS) or other chips or electronic devices in which an insulating layer with reflow characteristics is desirable. As used herein, the term "semiconductor device" includes any of the aforementioned devices, including DRAM chips, logic chips, and merged DRAM logic chips.

As shown in FIG. 1, a semiconductor device has a number of metal alloy or polysilicon gate conductors 15 formed on the surface of a silicon substrate 10. Silicon substrate 10 may or may not include additional films necessary in the processing of the semiconductor device. The present invention is most applicable where the trenches or channels between the gate conductors have an aspect ratio (depth to width) greater than 6:1 where the width "w" of the channel is about 0.05 $\mu$m or less and "d" is the depth of the channel.

Figure 2:
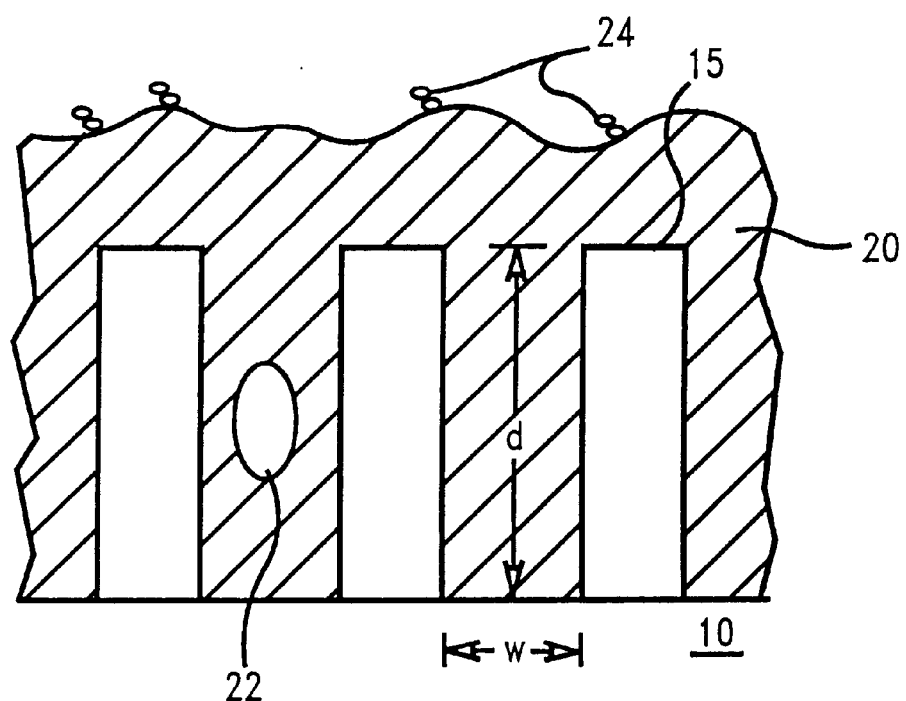
FIG. 2 is an elevated partial cross-section of a typical semiconductor device with an insulating glass film of the prior art as-deposited thereon.

Referring now to FIG. 2, a commercially unacceptable integrated circuit structure of the prior art is shown having an insulating glass film 20 formed thereon substrate 10 having gate conductors 15 containing voids 22 and/or surface crystals 24. The channels or trenches formed between the gates 15 must be completely filled with the insulating glass layer without any significant voids or surface defects. Surface crystals 24 are generally formed when the insulating glass film has been doped with boron and phosphorous having dopant concentrations greater than 10.0 wt % combined.

Generally, the insulating glass film 20 is conventionally applied using chemical vapor deposition followed by reflow. Typically, the reflowing of the insulating glass film will reduce the number of voids, however, surface crystals can still be present in the reflowed structure. In addition, the insulating glass films of the prior art having an amount of boron or phosphorous greater than 5.0 wt % are generally hygroscopic.

Figure 3:
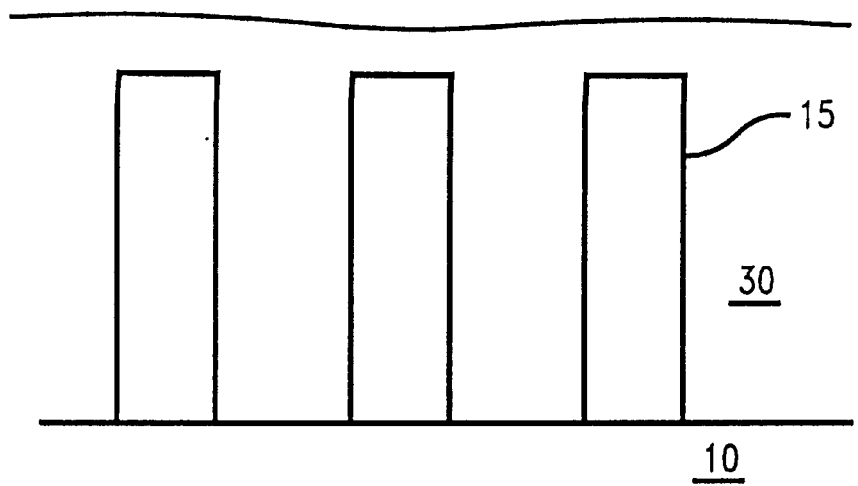
FIG. 3 is an elevated partial cross-section of a semiconductor device having an insulating glass film of the present invention substantially free of voids and surface defects.

FIG. 3 depicts a semiconductor device having an insulating glass film made according to the method of the present invention. A semiconductor substrate 10 has a series of gates or raised lines 15 thereon coated with a layer of FBPSG 30 using the method of the present invention. The FBPSG 30 shows substantially no voids or surface defects in the layer which would make the device commercially unacceptable and it is this type of glass layered electronic device which is desired by the electronic fabrication industry. Made in a sub-atmospheric chemical vapor deposition chamber, the FBPSG preferably contains boron at a concentration of less than or equal to about 5.0 wt %, a phosphorus concentration of less than about 4.0 wt %, and a fluorine concentration of about 0.1 to 2.0 wt %. The sub-atmospheric chemical vapor deposition chamber preferably allows the gaseous precursors used in the present invention to be introduced into the chamber from the top, and are well known in the art.

The fluorine incorporated BPSG of the present invention is formed using gaseous sources of phosphorus and boron dopants and silicon using a fluorine source, preferably, a fluoroethoxysilane. The gaseous reactants will also include a gaseous source of oxygen which includes ozone, an ozone oxygen mixture, or hydrogen peroxide. An inert carrier gas such as argon, nitrogen, or helium is also typically present in the mixture of gases and preferred from a process operating standpoint.

Most preferably the gaseous source of silicon is tetraethylorthosilicate (TEOS). The gaseous sources of boron and phosphorous may comprise any gases containing boron or phosphorous. The boron and phosphorous sources may contain any other materials which will not interfere with the formation of the FBPSG capable of decomposing and reacting with both the TEOS and the fluorine source with the oxygen source at the specified pressure and temperature ranges of the process. Preferably, such gaseous sources of boron and phosphorous will be organic boron containing and phosphorous containing gases which will decompose at the deposition temperature with the remaining components of the gases volatilizing and removed by the vacuum pumping system used to maintain the vacuum in the reaction chamber.

Most preferably, examples of such gaseous sources of boron and phosphorous include triethylborate (TEB), trimethylborate (TMB), phosphine, triethyiphosphate (TEPO), and the like and mixtures thereof. Even more preferably, gaseous sources of boron and phosphorous are TEB and TEPO, respectively, because of their demonstrated effectiveness. The gaseous sources of fluorine are, preferably, fluorotriethoxysilane (FTES), difluorosilane, trifluorosilane and tetrafluorosilane, most preferably, FTES. Where the gaseous fluorine source is tetrafluorosilane or trifluorosilane, a plasma must be ignited inside the chamber in order for the FBPSG film to be deposited onto the substrate.

The vaporized reactant sources are typically mixed with the inert carrier gas such as nitrogen, argon or helium using a liquid injection system well known in the art. Generally, a liquid injection system utilizes pressurized liquid lines to deliver a liquid reactant to a cavity where it is volatilized and then the vapor is fed into the reaction chamber. If more than one liquid is to be fed as a gaseous mixture to the reaction chamber, each liquid is individually vaporized and then injected as a gaseous mixture. The gaseous reactant and/or vaporized liquid reactant may also be injected separately into the reaction chamber. The vaporized reactant sources react with each other to form the FBPSG layer over the substrate and filling the gaps thereon.

Figure 4:
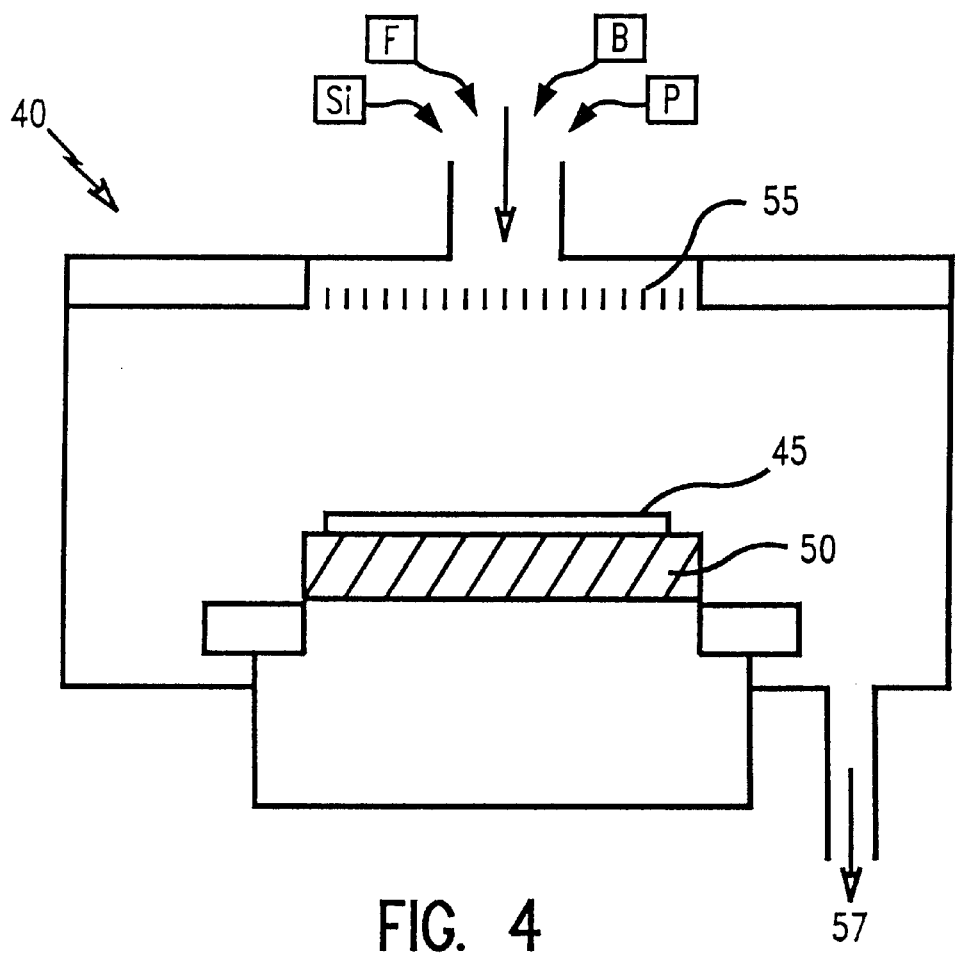
FIG. 4 is an elevated cross-section of a subatmospheric chemical vapor deposition chamber used in the present invention.

In FIG. 4, reaction chamber 40 is shown having the four separate gaseous reactants injected separately into the reaction chamber 40 through showerhead 55. The wafer 45 is heated by the susceptor 50 to a reaction temperature of about 480° to 650° C. The pressure inside the chamber is about 200 to 760 Torr. Alternatively, a preferred method is to combine the gaseous sources of boron and phosphorous dopants with a suitable inert carrier gas as one injection stream while the TEOS and the FTES comprise another injection stream. The oxygen source may be mixed with either or both of these streams.

In a preferred embodiment, a deposition temperature of about 500° C. is employed which provides an in-situ reflow of the deposited FBPSG layer during the deposition process. Due to this in-situ reflow, wafer openings with both high and low aspect ratio gaps can be filled without a subsequent reflow anneal. Regardless of the deposition conditions used, the deposition may be, and typically is, followed by an anneal at a temperature of about 500° to 725° C. However, semiconductor devices having low aspect ratio gaps may not require a subsequent anneal or reflow for adequate gap fill. This provides increased operating efficiencies and cost reduction for the manufacturing process. In addition, the process temperatures of the current invention fall well below the thermal budget of DRAMs and most logic chips.

The flow rates of the gaseous reactants into the deposition chamber is preferably about 32.25 to 75.26 standard cubic centimeter per minute (sccm) of TEOS, most preferably about 53.8 sccm; about 6.15 to 61.5 sccm of FTES, most preferably about 12.3 sccm; about 2.5 to 9.85 sccm of TEPO, most preferably about 4.9 sccm; about 15.34 to 30.70 sccm of TEB, most preferably about 23.0 sccm; and the ozone/oxygen mixture is flowed in at a rate of about 2 to 6 standard cubic liters per minute (slm), most preferably about 4 slm. These parameters allow for a deposition rate of about 2000 to 6000 Å/minute. In general, the flow rates of the reactants will be employed to provide a FBPSG film having a composition of about 2.0 to 5.0 wt % boron, 2.0 to 4.0 wt % phosphorus, and 0.1 to 2.0 wt % fluorine.

An alternative embodiment of the present invention comprises a two step method of filling high aspect ratio gaps greater than 6:1 on a semiconductor wafer. Utilizing the same gaseous reactants, an FBPSG film is deposited at a low deposition rate of about 600 Å/minute. Typically, the resulting FBPSG has a boron and phosphorous concentration of less than or equal to about 5.0 wt % of boron, about 4.0 wt % of phosphorous, and about 0.1 to 2.0 wt % fluorine. The FBPSG film substantially fills the gaps having aspect ratios greater than 6:1 and which are approximately 500 Å wide. The FBPSG film is deposited in a sub-atmospheric chemical vapor deposition chamber at a pressure of about 600 Torr, at a temperature of about 500° C.

The gaseous reactants are flowed into the reaction chamber at the following rates: about 10.80 to 32.25 sccm for silicon, most preferably, TEOS at about 18.8 sccm; about 2.50 to 9.85 sccm for fluorine, most preferably, FTES at about 6.2 sccm; about 2.5 to 9.85 sccm for phosphorus, most preferably, TEPO at about 4.9 sccm; about 3.07 to 12.27 sccm for boron, most preferably, TEB at about 7.7 sccm; and an ozone/oxygen flow rate of about 4.0 slm such that ozone is present in the reaction chamber at about 12 wt %.

The deposition of the FBPGS film is followed by a much thicker insulating glass film having a thickness of at least 3000 to 6000 Å. This thicker layer fills the larger gap features having a width of approximately 5000 Å wide, and acts to planarize and cover the entire surface of the wafer. This thicker insulating film may not require any dopants, or as an alternative, contains lower boron, phosphorous, and fluorine concentrations than the FBPSG film underneath. Deposition of the thicker film may be followed by steam annealing at a temperature at or below 700° C. Again, this process falls well below the thermal budget required for DRAM and logic chips.

EXAMPLE

FBPSG films of the present invention were produced in accordance with the first embodiment of the aforementioned process in a chemical vapor deposition chamber, specifically, an Applied Materials P5000 SABPSG reactor. The following tables show the results of the gap fill for as-deposited and annealed films comparing the prior art BPSG films with the FBPSG films of the present invention.

Semiconductor wafers with gaps having aspect ratios of about 1:1 and a width of about 0.3 μm were used to compare the quality of an as-deposited prior art BPSG film and an as-deposited FBPSG film of the present invention. Deposition of the films occurred at 480° C. at a sub-atmospheric pressure of about 200 Torr.

TABLE I

| | As-deposited Films | | | |
|---|---|---|---|---|
| Film | [B] (wt %) | [P] (wt %) | [F] (wt %) | Results |
| BPSG | 4.5 | 4.2 | — | significant voids |
| FBPSG | 4.4 | 4.0 | 2.0 | substantially void-free |

The prior art BPSG film showed significant voids in the as-deposited film whereas the FBPSG film was substantially void-free.

Semiconductor wafers with gaps having aspect ratios of about 8:1 and widths of about 0.04 μm were used to compare the quality of a prior art BPSG film and an FBPSG film of the present invention subsequent to dry oxidation anneal. Deposition of the films occurred at 480° C. at a sub-atmospheric pressure of about 200 Torr.

TABLE II

| | Annealed Films | | | | | |
|---|---|---|---|---|---|---|
| Film | [B] (wt %) | [P] (wt %) | [F] (wt %) | Anneal T (° C.) | Anneal time (min.) | Results |
| BPSG | 4.6 | 4.0 | — | 850 | 25 | significant voids |
| FBPSG | 4.4 | 4.0 | 2.0 | 750 | 30 | substantially void-free |

The prior art BPSG film required annealing at about 850° C. for about 25 minutes. Subsequent to high temperature annealing of the prior art film, significant voids were still present resulting in a commercially unacceptable semiconductor device. The FBPSG film of the present invention required annealing at about 750° C. for about 30 minutes producing a substantially void-free film ideal for further processing steps or as a final dielectric film.

The present invention achieves the objects stated above. The method of the present invention for depositing an FBPSG film provides a film with superior gap fill properties both as-deposited and following anneal in aspect ratio gaps greater than 6:1. The resultant FBPSG film requires a lower reflow temperature such that temperature damaging effects to the semiconductor device are avoided during the fabrication process. The lower viscosity of the FBPSG film of the present invention does not require increasing the dopant concentrations of boron and phosphorus, thus, potential crystallite defects and hygroscopicity are kept to a minimum.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of forming a fluorine doped oxide glass film on a semiconductor device in a chemical vapor deposition chamber comprising the steps of:
   (a) providing a semiconductor device in said chamber;
   (b) providing a gaseous silicon source;
   (c) providing a gaseous oxygen source;
   (d) providing a gaseous fluorine source;
   (e) providing a gaseous boron source;
   (f) providing a gaseous phosphorus source;
   (g) injecting said gaseous sources into said chamber; and
   (h) depositing a layer of fluorine doped oxide glass on said semiconductor device at a temperature of about 480° C. to 650° C. and a sub-atmospheric pressure of about 200 to 750 Torr.

2. The method of claim 1, further including the step of reflowing said layer of doped oxide glass on said semiconductor substrate at a temperature of about 480° C. to 725° C.

3. The method of claim 2, wherein said step of reflowing comprises steam annealing.

4. The method of claim 2, wherein said step of reflowing and said step (h) occurs simultaneously.

5. The method of claim 1 wherein in step (a) said semiconductor device comprises a logic chip.

6. The method of claim 1 wherein in step (a) said semiconductor device comprises a dynamic random access memory chip.

7. The method of claim 1 wherein in step (a) said semiconductor device comprises a merged logic and dynamic random access memory chip.

8. The method of claim 1 wherein in step (b) said gaseous silicon source comprises tetraethylorthosilicate.

9. The method of claim 1 wherein in step (d) said gaseous fluorine source is selected from the group consisting of fluorotriethoxysilane, difluorosilane, trifluorosilane, and tetrafluorosilane.

10. The method of claim 1 wherein said gaseous fluorine source comprises trifluorosilane or tetrafluorosilane and wherein in step (h) a plasma is generated prior to depositing a layer of fluorine doped oxide glass on said semiconductor device.

11. The method of claim 1 wherein in step (d) said gaseous fluorine source comprises fluorotriethoxysilane.

12. The method of claim 1 wherein in step (e) said gaseous boron source is selected from the group consisting of triethylborate, trimethylborate, and mixtures thereof.

13. The method of claim 1 wherein in step (f) said gaseous phosphorus source is selected from the group consisting of tetraethylphosphate, phosphine, triethylphosphate, and mixtures thereof.

14. The method of claim 1 wherein said layer of fluorine doped oxide glass fills high aspect ratio gaps on said semiconductor device having an aspect ratio greater than 7:1.

15. The method of claim 1 wherein step (g) comprises injecting said gaseous sources separately into said chamber.

16. The method of claim 1 wherein step (g) comprises premixing said silicon and fluorine sources as a first injection stream, premixing said boron and phosphorus sources as a second injection stream prior to injecting said gaseous sources into a chemical vapor deposition chamber.

17. The method of claim 1 wherein step (h) occurs at a temperature of about 550° C. to 650° C.

18. The method of claim 1 wherein in step (c) said gaseous oxygen source is selected from the group consisting of ozone, oxygen/ozone mixtures, and hydrogen peroxide.

19. The method of claim 1 wherein said layer of fluorine doped oxide glass contains less than or equal to about 5.0 wt % of boron.

20. The method of claim 1 wherein said layer of fluorine doped oxide glass contains less than about 4.0 wt % of phosphorus.

21. The method of claim 1 wherein said layer of fluorine doped oxide glass contains about 0.1 to 2.0 wt % fluorine.

22. The method of claim 1 wherein said step (h) forms a final deposition layer on said semiconductor device.

23. The method of claim 1 wherein said step (h) forms a planarized intermediate layer on said semiconductor device and further including the step of continuing processing of said semiconductor device.

24. The method of claim 1 further including the step of reacting said gaseous sources to deposit said layer of fluorine doped oxide glass on said semiconductor device.

25. A method of filling high aspect ratio gaps on a semiconductor wafer comprising the steps of:
a) providing a semiconductor wafer having high aspect ratio gaps of greater than 7:1; and b) filling said gaps with fluoroborophosphosilicate glass by:
i) providing a gaseous tetraethylorthosilicate source;
ii) providing gaseous oxygen source;
iii) providing a gaseous fluorine source selected from the group consisting of fluorotriethoxysilane, difluorosilane, trifluorosilane, and tetrafluorosilane;
iv) providing a gaseous boron source selected from the group consisting of triethylborate, trimethylborate, and a mixture thereof;
v) providing a gaseous phosphorus source selected from the group consisting of tetraethylphosphate, phosphine, triethylphosphate, and a mixture thereof; and
vi) chemically vapor depositing the flourborophosphosilicate glass film at a temperature of about 480° C. to 650° C. and a pressure of about 200 to 750 Torr, wherein the flouroborophosphosilicate glass film contains less than or equal to about 5.0 wt % boron, less than about 4.0 wt % phosphorus and about 0.1 to 2.0 wt % fluorine and is substantially void-free.

26. The method of claim 25 further including the step of reacting said gaseous sources to deposit said layer of fluorine doped oxide glass on said semiconductor device.

27. The method of claim 25 further including the step of annealing said insulating glass film at a temperature of about 700° to 725° C.

28. A method of forming an insulating film on a semiconductor wafer comprising the steps of:
(a) providing a semiconductor wafer having a plurality of high aspect ratio gaps thereon;
(b) providing a gaseous source of silicon, fluorine, boron, phosphorus and oxygen for chemical vapor depositing a first insulating glass film over said wafer at a temperature of about 480° to 650° C. and a pressure of about 200 to 750 Torr at a rate of about 400 to 1000 Å/minute;
(c) substantially filling said gaps with said first insulating glass film containing less than or equal to about 5.0 wt % boron, less than about 4.0 wt % phosphorus, and about 0.1 to 2.0 wt % fluorine; and
(d) coating the surface of said wafer by chemically vapor depositing a second insulating glass film containing a lower boron, fluorine, and phosphorous concentration than said first insulating glass film.

29. The method of claim 28 wherein said silicon source flows into said chamber at a rate of about 10.80 to 32.25 sccm.

30. The method of claim 28 wherein said silicon source comprises tetraethylorthosilicate flowing into said chamber at a rate of about 18.8 sccm.

31. The method of claim 28 wherein said fluorine source flows into said chamber at a rate of about 2.50 to 9.85 sccm.

32. The method of claim 28 wherein said fluorine source comprises fluorotriethoxysilane flowing into said chamber at a rate of about 6.2 sccm.

33. The method of claim 28 wherein said boron source flows into said chamber at a rate of about 3.07 to 12.27 sccm.

34. The method of claim 28 wherein said boron source comprises triethylborate flowing into said chamber at a rate of about 7.7 sccm.

35. The method of claim 28 wherein said phosphorus source flows into said chamber at a rate of about 2.5 to 9.85 sccm.

36. The method of claim 28 wherein said phosphorus source comprises triethylphosphate flowing into said chamber at a rate of about 4.9 sccm.

37. The method of claim 28 wherein step (d) comprises coating the surface of said wafer by chemically vapor depositing an undoped glass film.

38. The method of claim 28 further comprising the step of annealing said first and second insulating glass films at or below 700° C.

39. The method of claim 28 further including, after step (b), the step of reacting said gaseous sources to deposit said layer of fluorine doped oxide glass on said semiconductor wafer.

* * * * *